United States Patent
Ni et al.

(10) Patent No.: US 11,086,425 B2
(45) Date of Patent: Aug. 10, 2021

(54) TOUCH DISPLAY APPARATUS AND DRIVING METHOD THEREFOR

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Huan Ni, Beijing (CN); Xiaohua Lin, Beijing (CN); Xiao Guo, Beijing (CN); Xinxia Zhang, Beijing (CN); Qun Li, Beijing (CN); Bo Yang, Beijing (CN); Fengzhen Lv, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 241 days.

(21) Appl. No.: 16/338,230

(22) PCT Filed: Oct. 12, 2018

(86) PCT No.: PCT/CN2018/109934
§ 371 (c)(1),
(2) Date: Mar. 29, 2019

(87) PCT Pub. No.: WO2019/205503
PCT Pub. Date: Oct. 31, 2019

(65) Prior Publication Data
US 2020/0326803 A1    Oct. 15, 2020

(30) Foreign Application Priority Data
Apr. 25, 2018  (CN) .......................... 201810379098.4

(51) Int. Cl.
*G06F 3/041* (2006.01)
*G02F 1/1335* (2006.01)
(Continued)

(52) U.S. Cl.
CPC ........ *G06F 3/0412* (2013.01); *G02F 1/13338* (2013.01); *G02F 1/133514* (2013.01);
(Continued)

(58) Field of Classification Search
CPC ...... G06F 3/0412; G06F 3/0416; G06F 3/042; G02F 1/13338; G02F 1/133514; G02F 2001/133521; H01L 27/322; H01L 27/323
See application file for complete search history.

(56) References Cited

U.S. PATENT DOCUMENTS 6,483,498 B1 *  11/2002  Colgan ................... G06F 3/045
                                                      178/18.05
6,501,529 B1 *  12/2002  Kurihara ............. G02F 1/13338
                                                        345/173
(Continued)

FOREIGN PATENT DOCUMENTS

CN        102147540        8/2011
CN        103236435 A      8/2013
(Continued)

OTHER PUBLICATIONS

First Office Action and English language translation, CN Application No. 201810379098.4, dated Apr. 15, 2020, 14 pp.
(Continued)

*Primary Examiner* — Ricardo Osorio
(74) *Attorney, Agent, or Firm* — Myers Bigel, P.A.

(57) ABSTRACT

The present disclosure relates to the field of touch display technology, and in particular, provides a touch display apparatus and a driving method therefor. Specifically, the touch display apparatus includes a first substrate and a
(Continued)

second substrate opposite to each other, a light source on a side of the second substrate facing the first substrate, a plurality of touch sensors in an array on a side of the first substrate facing the second substrate, and one or more interference color filters on a side of each touch sensor facing the second substrate. Specifically, the light source is configured to emit light towards each interference color filter. Further, each interference color filter comprises a first sub-interference color filter, a second sub-interference color filter and a third sub-interference color filter configured to output different colors of light respectively.

5 Claims, 2 Drawing Sheets

(51) Int. Cl.
   *G02F 1/1333* (2006.01)
   *G06F 3/042* (2006.01)
   *H01L 27/32* (2006.01)
(52) U.S. Cl.
   CPC ............ *G06F 3/042* (2013.01); *G06F 3/0416* (2013.01); *H01L 27/322* (2013.01); *H01L 27/323* (2013.01); *G02F 1/133521* (2021.01)

(56) References Cited

U.S. PATENT DOCUMENTS

| | | | |
|---|---|---|---|
| 9,898,147 B2* | 2/2018 | Donnelly | G06F 3/0412 |
| 10,446,112 B2* | 10/2019 | Xu | G09G 3/20 |
| 10,553,179 B2* | 2/2020 | Holenarsipur | G01J 1/44 |
| 2008/0239696 A1 | 10/2008 | Kleverman et al. | |
| 2014/0117324 A1* | 5/2014 | Kim | G06F 3/0445 |
| | | | 257/40 |
| 2015/0048348 A1 | 2/2015 | Huang et al. | |
| 2015/0318506 A1 | 11/2015 | Zhou et al. | |
| 2016/0370655 A1 | 12/2016 | Nagayama et al. | |
| 2017/0045780 A1* | 2/2017 | Xu | G02F 1/133621 |
| 2017/0060309 A1* | 3/2017 | Chen | G02F 1/133512 |
| 2017/0139515 A1* | 5/2017 | Lee | G02F 1/13338 |
| 2017/0338289 A1* | 11/2017 | Seo | H01L 27/3223 |
| 2018/0292713 A1* | 10/2018 | Drolet | G02F 1/133617 |
| 2018/0348958 A1 | 12/2018 | Lee et al. | |
| 2020/0142259 A1* | 5/2020 | Liu | G02F 1/133603 |
| 2020/0249787 A1* | 8/2020 | Koide | G06F 3/04166 |

FOREIGN PATENT DOCUMENTS

| | | |
|---|---|---|
| CN | 103853393 A | 6/2014 |
| CN | 104377226 | 2/2015 |
| CN | 104536198 | 4/2015 |
| CN | 104880842 A | 9/2015 |
| CN | 105116595 | 12/2015 |
| CN | 206558505 U | 10/2017 |
| CN | 108595050 | 9/2018 |
| WO | 2007/045598 A1 | 4/2007 |

OTHER PUBLICATIONS

International Search Report and Written Opinion of the International Searching Authority (with English language translation of Written Opinion), International Application No. PCT/CN2018/109934, dated Jan. 30, 2019, 13 pages.

* cited by examiner

TOUCH DISPLAY APPARATUS AND DRIVING METHOD THEREFOR

CROSS REFERENCE TO RELATED APPLICATION(S)

The present application is a 35 U.S.C. 371 national stage application of PCT International Application No. PCT/CN2018/109934, filed on Oct. 12, 2018, which claims the benefit of Chinese Patent Application No. 201810379098.4 filed on Apr. 25, 2018, the contents of which are incorporated herein by reference in their entireties.

TECHNICAL FIELD

The present disclosure relates to the field of touch display technology, and specifically provides a touch display apparatus and a driving method therefor.

BACKGROUND

With the development of display technology, under many practical conditions, users often need that the display device can not only achieve normal display, but also have touch function, thereby forming a touch display device. In such a case, on the one hand, the touch display device can display any required picture or text according to the user's desire; meanwhile, on the other hand, with the help of touch function, the user can also interact with the touch display device effectively to provide some necessary input information into it. For example, the user can scroll a display picture of the touch display device in an up and down direction by touching the up and down arrows displayed on a screen of the touch display device. As an alternative example, the user can also redirect the display picture of the touch display device to a new web page or window by selecting a redirect button displayed on the screen.

In view of above, and in order to further improve interactions between the user and the touch display device, an increasing research is progressively focused on the touch display device with higher performance and efficiency, as well as lower production cost and complexity.

Furthermore, with the help of the latest research progress with respect to organic light emitting materials, the entire display field has gradually developed from the liquid crystal display era to the organic light emitting display era. Therefore, as organic light emitting display technology gradually matures, more and more researchers also start to be dedicated to providing additional touch function for simple organic light emitting devices.

Therefore, in the case of considering the continuous and strong demands for light and thin light emitting devices, how to integrate high-performance touch modules into a light and thin display device (in particular, an organic light emitting display device) is a key study direction that those skilled in the art are spending more and more time at.

SUMMARY

According to an aspect of the present disclosure, a touch display apparatus is provided. Specifically, the touch display apparatus comprises: a first substrate and a second substrate opposite to each other; a light source on a side of the second substrate facing the first substrate; a plurality of touch sensors in an array on a side of the first substrate facing the second substrate; and one or more interference color filters on a side of each touch sensor facing the second substrate. Further, the light source is configured to emit light towards each interference color filter. Furthermore, each interference color filter comprises a first sub-interference color filter, a second sub-interference color filter, and a third sub-interference color filter configured to output different colors of light respectively.

According to a specific implementation, in the touch display apparatus provided by an embodiment of the present disclosure, the light source comprises a plurality of sub-light sources in an array, and an orthographic projection of each sub-light source on the first substrate is covered by an orthographic projection of one sub-interference color filter on the first substrate.

According to a specific implementation, in the touch display apparatus provided by an embodiment of the present disclosure, each sub-light source comprises an organic light emitting diode (OLED) sub-light source configured to emit white light.

According to a specific implementation, in the touch display apparatus provided by an embodiment of the present disclosure, each sub-light source comprises an organic light emitting diode (OLED) sub-light source, and is configured to emit a same color of light as the one sub-interference color filter.

According to a specific implementation, in the touch display apparatus provided by an embodiment of the present disclosure, in each interference color filter, the first sub-interference color filter is configured to emit red light, the second sub-interference color filter is configured to emit green light, and the third sub-interference color filter is configured to emit blue light.

According to a specific implementation, in the touch display apparatus provided by an embodiment of the present disclosure, the light source comprises a surface light source and a liquid crystal layer stacked over each other. Further, the surface light source is configured to emit white light, and the liquid crystal layer comprises a plurality of liquid crystal portions in an array, wherein an orthographic projection of each liquid crystal portion on the first substrate is covered by an orthographic projection of one sub-interference color filter on the first substrate.

According to a specific implementation, in the touch display apparatus provided by an embodiment of the present disclosure, the light source further comprises a color film layer. Specifically, the color film layer comprises a plurality of color film units, wherein an orthographic projection of each color film unit on the first substrate is covered by an orthographic projection of one sub-interference color filter on the first substrate, and each color film unit is configured to emit a same color of light as the one sub-interference color filter.

According to another aspect of the present disclosure, a driving method for the touch display apparatus as described in any of the above embodiments is also provided. Specifically, the driving method comprises the following steps: driving the light source and each interference color filter to display in a set gray scale; recording a non-touch color coordinate in a color space for light output from each interference color filter in the case of no touch; recording a touch color coordinate in a color space for light output from each interference color filter in the case of touch; and determining a touch position by comparing the non-touch color coordinate and the touch color coordinate.

According to a specific implementation, in the driving method for the touch display apparatus as provided in an embodiment of the present disclosure, the color space comprises CIE 1964 color space, and the non-touch color coordinate and the touch color coordinate comprise chrominance component coordinate.

According to a specific implementation, in the driving method for the touch display apparatus as provided in an embodiment of the present disclosure, the light source comprises an organic light emitting diode (OLED) light source. Further, the driving method further comprises: repeating the following steps at different display moments in time of the organic light emitting diode (OLED) light source: driving the organic light emitting diode (OLED) light source and each interference color filter to display in a set gray scale; recording a non-touch color coordinate in a color space for light output from each interference color filter in the case of no touch; recording a touch color coordinate in a color space for light output from each interference color filter in the case of touch; and determining a touch position by comparing the non-touch color coordinate and the touch color coordinate.

DETAILED DESCRIPTION OF THE DISCLOSURE

A touch display apparatus and a driving method therefor as provided in embodiments of the present disclosure will be clearly and in detail illustrated below in conjunction with the accompanying drawings.

Figure 1:
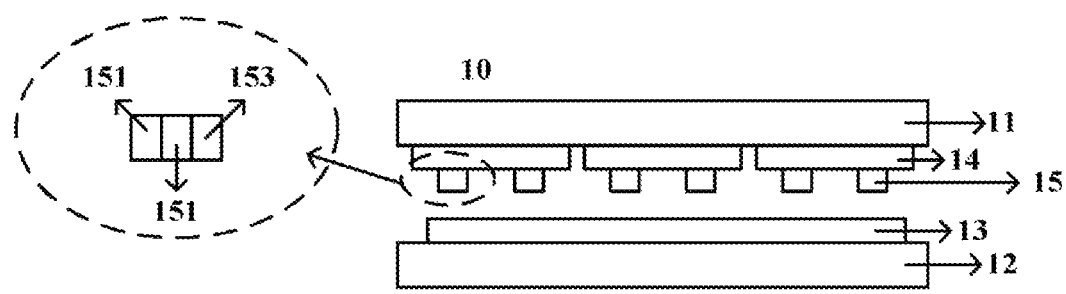
FIG. 1 schematically illustrates a cross-sectional view of a touch display apparatus according to an embodiment of the present disclosure, wherein an interference color filter in the touch display apparatus is also shown in a zoomed view.

Referring to FIG. 1, a cross-sectional view of a touch display apparatus according to an embodiment of the present disclosure is schematically illustrated. Specifically, as shown in FIG. 1, the touch display apparatus 10 may comprise a first substrate 11 and a second substrate 12, wherein the first substrate 11 and the second substrate 12 are disposed opposite to each other. Furthermore, a light source 13 is further provided on an upper surface of the second substrate 12 (i.e., the surface facing the first substrate 11) of the touch display apparatus 10, and a plurality of touch sensors 14 arranged in an array is further provided on a lower surface of the first substrate 11 (i.e., the surface facing the second substrate 12) of the touch display apparatus 10. In addition, one or more interference color filters 15 may also be provided on a lower surface of each touch sensor 14 (i.e., the surface facing the second substrate 12). It should be noted that, although two interference color filters 15 provided on the lower surface of each touch sensor 14 are shown in FIG. 1, the present disclosure is not limited thereto. In fact, those skilled in the art should be able to easily envisage that any other suitable number (such as one, three, four and so on) of interference color filters 15 may be provided on the lower surface of each touch sensor 14 upon actual needs.

In an embodiment, the light source 13 may be configured to emit light and provide the emitted light to each of the interference color filters 15. After receiving the light emission from the light source 13, each of the interference color filters 15 can perform a color filtering process by an effect of thin film interference. That is to say, each interference color filter 15 outputs a specific color of light by the effect of thin film interference. Specifically, each interference color filter 15 may comprise a plurality of sub-interference color filters, for example, three sub-interference color filters. As shown in the zoomed view of FIG. 1, the interference color filter 15 may comprise three sub-interference color filters, for example, a first sub-interference color filter 151, a second sub-interference color filter 152, and a third sub-interference color filter 153. As an example, these three sub-interference color filters 151, 152, 153 are respectively configured to output different colors of light under the effect of thin film interference, for example, outputting respectively red light (R), green light (G) and blue light (B), thereby helping to achieve RGB color display.

Here, it should be noted that, although the three sub-interference color filters 151, 152, 153 are shown to be arranged side by side directly adjacent to each other in the zoomed view of FIG. 1, i.e., there is no gap between two adjacent sub-interference color filters, this does not indicate any limitation to the present disclosure. In fact, those skilled in the art should readily appreciate that under the premise of benefiting from teachings of the present disclosure, various arrangements or distributions for respective sub-interference color filters 151, 152, 153 are possible within the interference color filter 15. For example, when each of the interference color filters 15 comprises four sub-interference color filters for outputting different colors of light, for example, for outputting red light (R), green light (G), blue light (B) and white light (W) respectively, such four sub-interference color filters may be arranged in a 2×2 matrix or, alternatively, may also be arranged in the same row. Likewise, in each of the interference color filters 15, any two adjacent sub-interference color filters may be directly adjacent as that in FIG. 1, or any suitable gap may exist between them.

As an optional implementation, for the touch display apparatus 10 shown in FIG. 1, the light source 13 may be selected as a surface light source, and in particular, made of an organic light emitting material adapted to emit white light. Furthermore, as indicated above, each interference color filter 15 may comprise a red sub-interference color filter 151, a green sub-interference color filter 152, and a blue sub-interference color filter 153. In such a case, the white light emitted from the light source 13 will enter each of the interference color filters 15 respectively, i.e., entering the respective sub-interference color filters 151, 152, 153. With the help of the effect of thin film interference, red light, green light, and blue light will be output from above the red sub-interference color filter 151, the green sub-interference color filter 152, and the blue sub-interference color filter 153 respectively. It can be seen that, to a certain extent, the interference color filters 15 arranged in an array can be equivalent in function to a color film substrate in a conventional liquid crystal display device. That is to say, each of the interference color filters 15 can function as a display pixel, and accordingly, each of the sub-interference color filters 151, 152, and 153 can function as a display sub-pixel. In other words, for the white light emitted from the light source 13, the respective sub-interference color filters 151, 152, and 153 in each of the interference color filters 15 can output a corresponding color of light by the effect of thin film interference, thereby realizing color display.

Next, how to detect a touch position using the touch display apparatus as provided in embodiments of the present disclosure will be described in detail with reference to FIG. 1 and the previous related description about the display process. Obviously, it should be noted herein that only relevant components within the touch display apparatus closely related to embodiments of the present disclosure are shown in FIG. 1. Other conventional components within the touch display apparatus, for example, a driver circuit for the light source 13 (e.g., formed of an organic light emitting material) and so on are not shown explicitly in FIG. 1. However, this does not indicate that such components do not exist in the touch display apparatus as provided by embodiments of the present disclosure. In fact, all these conventional components not explicitly shown herein are common in the art. Therefore, structures, functions, and the like of these conventional components should be readily appreciated and understood by those skilled in the art, and the present disclosure will not describe in detail in this regard.

For example, at a particular moment in time during the display process, for example, the light source 13 can be driven by the drive circuit to emit light of a particular intensity, such that the respective sub-interference color filters 151, 152 and 153 can display at corresponding colors and grayscales with the help of the effect of thin film interference. At such a moment, if the user does not touch the display apparatus 10, i.e., the first substrate 11 will remain in an initial flat state, each of the sub-interference color filters 151, 152 and 153 will provide a light output of the initial color, which has an initial or reference center wavelength $\lambda 0$. After that, if the user touches the display apparatus 10, the first substrate 11 will be deformed, for example, recessed downward at the touch position, thereby causing the sub-interference color filters 151, 152, and 153 located therein to be deformed. In such a case, due to the deformation of sub-interference color filters 151, 152, and 153 at the touch position, the light incident thereon from the light source 13 will have an incident angle different from that in the original non-touch state. For example, when light from the surface light source 13 is incident vertically upward on each sub-interference color filter 151, 152, and 153 under the non-touch state, if one or some sub-interference color filter 151, 152, and 153 deform due to the touch, it will lead to that the incident light from the surface light source 13 can no longer be vertically incident on the deformed sub-interference color filters 151, 152 and 153. Thereby, a spectral distribution of the light output from the deformed sub-interference color filters 151, 152, and 153 will change, thereby causing the center wavelength of the output light to be shifted, that is, to become $\lambda'$. Therefore, by comparing the original or reference center wavelength $\lambda 0$ and the shifted center wavelength $\lambda'$ at different display positions of the entire touch display apparatus 10, the user's touch position can be determined. Because the center wavelength of light shifts due to the deformation of sub-interference color filters, in embodiments of the present disclosure, the touch position can be accurately detected on the touch display apparatus.

Further, in order to detect the touch position with a greater accuracy, the light output from each sub-interference color filter 151, 152, and 153 can be represented in a CIE 1964 color space. Specifically, the light output from each sub-interference color filter 151, 152, and 153 can be represented by means of the chrominance components u', v' in the CIE 1964 color space, for example, representing the color or center wavelength of light. Further optionally, gamma correction can also be performed on such chrominance components u', v', such that the result is more accurate and reliable. In such a case, for the touch display apparatus without any touch by user, the data u'0, v'0 at each display position can be measured, thereby obtaining a two-dimensional distribution of u'0, v'0 on the entire display surface. In other words, in the case of no touch by user, the data u'0 ($\lambda$, y) and v'0 (x, y) at different positions (x, y) on the entire display surface can be measured. Likewise, in the case of touch by user, since the light output from the sub-interference color filters 151, 152, and 153 at the touch position will be shifted in terms of for example the center wavelength, new data u'(x, y) and v'(x, y) at different positions (x, y) on the entire display surface can be measured in a similar manner. After that, by comparing the original or reference data u'0 (x, y), v'0 (x, y) when no touch occurs and the shifted data u' (x, y), v'(x, y) when a touch occurs, the touch position can be easily determined on the display apparatus. Typically, due to the occurrence of touch, the deformation of sub-interference color filters 151, 152, and 153 will cause the center wavelength of the output light to be shifted. Therefore, the chrominance component data, such as u' and v' in the CIE 1964 color space, for the output light will be changed drastically. In an embodiment of the present disclosure, by detecting values of such chrominance component data in the case of touch and no touch respectively, an accurate detection of touch position is realized.

It should be noted that, although how to achieve an accurate detection of the touch position in embodiments of the present disclosure is described in detail in the form of surface light source 13 above, the present disclosure is not only limited thereto. In fact, the light sources 13 can also be arranged in an array in a manner similar to the interference color filters 15. For example, referring to FIG. 2, a cross-sectional view of a touch display apparatus according to another embodiment of the present disclosure is schematically illustrated. The touch display apparatus 20 shown in FIG. 2 has substantially the same configuration as the touch display apparatus 10 shown in FIG. 1, wherein the only difference is the structure and distribution of the light source and the interference color filter. Similar to FIG. 1, in FIG. 2, the touch display apparatus 20 may comprise a first substrate 21, a second substrate 22, and a plurality of touch sensors 24 formed on the lower surface of the first substrate 21. As different from FIG. 1, in FIG. 2, the light source is no longer a single surface light source, but comprises a plurality of sub-light sources 231 arranged in a matrix. Further, as different from the case of FIG. 1, only one interference color filter 25 is provided on the lower surface of each touch sensor 24 in FIG. 2, and each interference color filter 25 comprises three sub-interference color filters 251, 252, 253 distributed at intervals from left to right. Optionally, as shown in FIG. 2, an orthographic projection of each sub-interference color filter 251, 252, 253 on the second substrate 22 corresponds to an orthographic projection of one sub-light source 231 on the second substrate 22.

Figure 2:
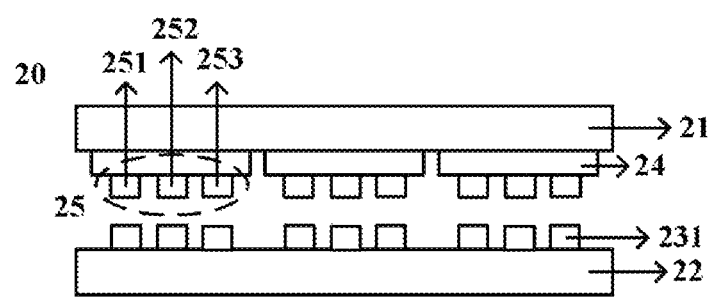
FIG. 2 schematically illustrates a cross-sectional view of a touch display apparatus according to another embodiment of the present disclosure.

For the touch display apparatus shown in FIG. 2, the conventional display and detection of the touch position can be achieved in a similar manner. For example, as an optional example, each sub-light source 231 can be an organic light emitting diode (OLED) sub-light source configured to emit white light. In such a case, since each of the sub-light sources 231 is disposed directly below the corresponding sub-interference color filter 251, 252, 253, similarly to the surface light source 13 shown above with reference to FIG. 1, the light input can be similarly provided to the corresponding sub-interference color filter 251, 252, 253. For example, in the case of no touch, the light input is provided to the respective sub-interference color filter 251, 252, 253 at a vertical upward incident angle; and for those sub-interference color filters 251, 252, 253 deformed at the touch position, the incident light will be no longer incident vertically. Thereby, as described in detail above, by comparing the center wavelengths or values of the chrominance component in the CIE 1964 color space of the light output from each sub-interference color filter 251, 252, 253 in two cases (i.e., with touch and without touch), the touch position can be accurately determined. Since such a determination process is similar to the case described above with reference to FIG. 1, the description will not be repeated herein.

Alternatively, in the touch display apparatus 20 of FIG. 2, each of the sub-light sources 231 may not be configured to emit white light, but instead configured respectively to emit the same color of light as the sub-interference color filter 251, 252, 253 over it. For example, if the left sub-interference color filter 251 is configured to output red light, the sub-light source 231 (for example, made of an organic light emitting material that emits red light) directly below it may be similarly arranged to emit red light. Similarly, assuming the intermediate sub-interference color filter 252 only filters out green light, then the sub-light source 231 directly below it may be an organic light emitting diode for emitting green light. Likewise, for the right, green sub-interference color filter 253, the sub-light source 231 directly below it can be adapted to emit green light. In such a case, since the sub-light source that provides light input for each of the sub-interference color filters 251, 252, 253 emits the same color of light as the respective sub-interference color filter, the effectiveness of the entire touch display system in terms of display and touch function is ensured. Furthermore, the sub-interference color filter and the sub-light source have the same array form, which also contributes to make both of them in the same mask process, thereby helping to simplify the fabrication process.

It should be noted herein that, although the display process and the touch detection process are described in detail with the organic light emitting type of touch display apparatus in all the foregoing description, this does not indicate any limitation to the present disclosure. In fact, in embodiments of the present disclosure, the touch display apparatus may also not be of the organic light emitting type, but instead has a liquid crystal layer and a corresponding backlight, that is, of a liquid crystal display type.

Figure 3:
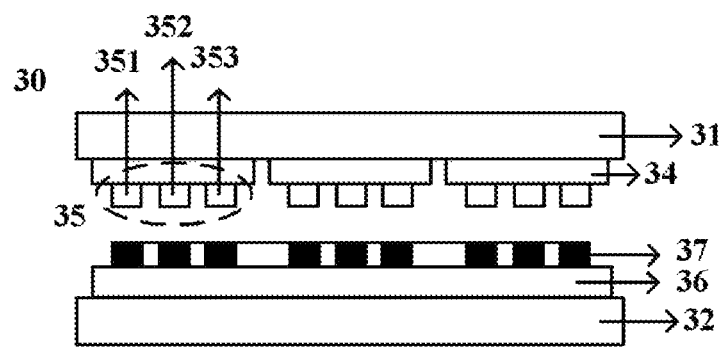
FIG. 3 schematically illustrates a cross-sectional view of a touch display apparatus according to yet another embodiment of the present disclosure.

Referring to FIG. 3, a cross-sectional view of a touch display apparatus according to yet another embodiment of the present disclosure is schematically illustrated. The touch display apparatus in FIG. 3 has substantially the same configuration as the touch display apparatus as shown previously in FIGS. 1 and 2, wherein the only difference is that the light source is no longer made of an organic light emitting material, but comprises a liquid crystal layer and a corresponding backlight. Specifically, as shown in FIG. 3, the touch display apparatus 30 can also comprise a first substrate 31, a second substrate 32, a plurality of touch sensors 34 disposed on the lower surface of the first substrate 31, and one interference color filter 35 formed on the lower surface of each touch sensor 34. Specifically, each interference color filter 35 comprises a plurality of sub-interference color filters 351, 352, and 353 that are juxtaposed and spaced apart from each other. Different from the case shown in FIG. 2, the light source in FIG. 3 comprises a surface light source 36 and a liquid crystal layer 37 that are stacked on the upper surface of the second substrate 32, wherein the surface light source 36 may be configured to provide white backlight. Further, the liquid crystal layer 37 may comprise several liquid crystal portions, as schematically illustrated by solid black blocks in FIG. 3, wherein each of the liquid crystal portions may respectively correspond to one sub-interference color filter 351, 352, and 353. It will be readily appreciated by those skilled in the art, for example, in the case where the sub-interference color filter 351 is configured to output red light, the sub-interference color filter 352 is configured to output green light, and the sub-interference color filter 353 is configured to output blue light, each of the sub-interference color filters 351, 352, 353 and the corresponding liquid crystal portion will respectively form one sub-pixel of the entire touch display apparatus 30, for example, R, G, B sub-pixels. At the same time, the group of these three interference color filters 351, 352, 353 and the respective three liquid crystal portions will form one pixel, for example, one complete pixel including three RGB sub-pixels. Regarding the process of implementing the normal display and the touch detection using the touch display apparatus 30 shown in FIG. 3, reference may be made to the detailed description presented above in conjunction with FIGS. 1 and 2, and for the sake of clarity, the present disclosure does not repeat the description herein.

Figure 4:
FIG. 4 schematically illustrates a cross-sectional view of a touch display apparatus according to still another embodiment of the present disclosure.

Further, in accordance with an optional embodiment, in the above touch display apparatus provided by the present disclosure, a color film layer may also be comprised. Specifically, referring to FIG. 4, a cross-sectional view of a touch display apparatus according to still another embodiment of the present disclosure is schematically illustrated. The touch display apparatus 40 shown in FIG. 4 has substantially the same configuration as the touch display apparatus 30 shown previously in FIG. 3. Specifically, as shown in FIG. 4, the touch display apparatus 40 may comprise a first substrate 41, a second substrate 42, a plurality of touch sensors 44 disposed on the lower surface of the first substrate 41, and one interference color filter 45 formed on the lower surface of each touch sensor 44. Specifically, each interference color filter 45 comprises a plurality of sub-interference color filters that are juxtaposed and spaced apart from each other. Different from the case shown in FIG. 3, in FIG. 4, in addition to the surface light source 46 and the liquid crystal layer 47 stacked on the upper surface of the second substrate 42, the light source may also comprise a plurality of color film units 481 formed at the topmost portion (i.e., closest to the first substrate 41). Specifically, the plurality of color film units 481 are arranged in an array in the same manner as the sub-interference color filters, that is, between one sub-interference color filter and the corresponding liquid crystal portion. At this time, it should be noted that, the color film unit 281 and the sub-interference color filter that are opposite to each other are specifically configured to output the same color of light, thereby ensuring the effectiveness of the entire touch display apparatus 40 in terms of normal display and touch detection.

Figure 5:
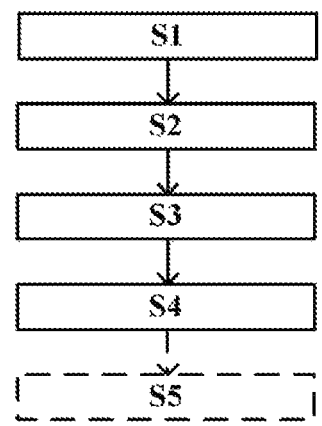
FIG. 5 schematically illustrates a flow chart of a driving method for a touch display apparatus according to an embodiment of the present disclosure.

According to another aspect of the present disclosure, a driving method for the touch display apparatus described in any of the above embodiments is also provided. Referring to FIG. 5, a flow chart of a driving method for the touch display apparatus according to an embodiment of the present disclosure is illustrated. Specifically, the driving method may comprise the following steps: S1, driving the light source and each of the interference color filters to display in a set gray scale; S2, recording a non-touch color coordinate in a color space (for example, an initial or reference chrominance component in the CIE 1964 color space) for the light output from each of the interference color filters in the case of no touch; S3, recording a touch color coordinate in a color space (the shifted chrominance component in the CIE 1964 color space) for the light output from each of the interference color filters in the case of touch; and S4, determining a touch position by comparing the chrominance components in both cases. By means of the above driving process, in particular, with the help of the interference color filters, an accurate detection of the touch position is achieved.

According to a specific embodiment, in the touch display apparatus, the light source may be an organic light emitting diode (OLED) light source. Those skilled in the art should appreciate that an OLED light emitting device generally has a certain luminescence lifetime. That is, the luminescence intensity thereof decays gradually with the use time of the device. This means for the organic light emitting devices that are at different stages of lifetime, the initial or reference center wavelengths of light output from each sub-interference color filter will likely be different at a particular display gray scale when no touch occurs. Therefore, in order to take into account the influence of the time factor, in an embodiment of the present disclosure, the method for driving the touch display apparatus may also comprise the following optional steps: S5, repeating all the steps S1-S4 as described above at different display moments in time of the organic light emitting diode (OLED) source. In such a case, the adverse effect of the luminescence decay due to the lifetime of organic luminescent material on the touch position detection can be effectively eliminated.

Alternatively, in an embodiment of the present disclosure, for a particular gray scale and display position, a variation for the chrominance component may also be set, i.e., thresholds respectively for $u'(x, y)-u'0(x, y)$ and $v'(x, y)-v'0(x, y)$, wherein such thresholds are mainly used to compensate for data fluctuations due to measurement errors. In this way, it will contribute to achieve a more accurate detection of the touch position. With regard to such thresholds, those skilled in the art, with the benefit from teachings of the present disclosure, should be able to select flexibly upon actual needs, and the present disclosure is not limited in this respect.

It should be noted herein that since the deformation of sub-interference color filters caused by touch is generally small, even if the center wavelength of the emitted light is shifted due to the angle change of the incident light, such a central wavelength shift is relatively small and generally does not exceed the coverage of respective color. For example, those skilled in the art should know that the wavelength of red light is generally in the range from 630 nm to 750 nm, and although the light emitted from the red sub-interference color filter will shift at the central wavelength due to deformation, this shift will not exceed the above wavelength range of red light. However, even if it is relatively small, the related data in the color space for the shift of such central wavelength can be significantly reflected. The same explanation applies equally to other colors of light, and the present disclosure will not describe again herein.

Further, it should also be noted that in embodiments of the present disclosure, the expression of "an orthographic projection of A on B" refers to the projection of A on B along a direction perpendicular to B. Furthermore, it should also be noted that in embodiments of the present disclosure, the expression of "A is covered by B" means that the outer contour of A is surrounded by the outer contour of B. Typically, this at least comprises the following two cases: first, A and B are completely coincident; and second, A is completely within the outer contour of B.

Further, those skilled in the art should understand that the term of "substantially" herein may also comprise embodiments having "completely", "fully", "all", and the like. Therefore, in embodiments, the adjectives substantially can also be removed. Where applicable, the term of "substantially" may also relate to 90% or higher, such as 95% or higher, particularly 99% or higher, even more particularly 99.5% or higher, including 100%. The term of "comprise" also comprises the embodiment in which the term of "comprise" means "consist of". The term of "and/or" particularly relates to one or more of the items mentioned before and after "and/or". For example, the phrase of "item 1 and/or item 2" and similar phrases may relate to one or more of item 1 and item 2. The term of "comprise" in an embodiment may refer to "consist of", but in another embodiment may refer to "comprise at least the defined species and optionally one or more other species".

In addition, the terms of first, second, third, etc. in the specification and the claims are used to distinguish between similar elements, and are not necessarily used to describe the sequence or time sequence. It is to be understood that the terms so used are interchangeable where appropriate, and embodiments of the present disclosure described herein can operate in other sequences than those described or illustrated herein.

Herein, the device is described during operation, among other aspects. As will be apparent to those skilled in the art, the present disclosure is not limited to methods of operation or devices in operation.

It should be noted that the above-mentioned embodiments illustrate rather than limit the present disclosure. Those skilled in the art will be able to design many alternative embodiments without departing from the scope of the appended claims. In the claims, any reference signs placed between parentheses shall not be construed as a limitation. The use of verb "comprise" and its conjugations does not exclude the presence of elements or steps other than those recited in the claims. The article of "a" or "an" preceding an element does not exclude the presence of a plurality of such elements. The present disclosure can be implemented by means of hardware comprising several discrete elements, and by means of a suitably programmed computer. In the device claim enumerating several means, several of these means can be embodied by one and the same item of hardware. The mere fact that certain measures are recited in mutually different dependent claims does not indicate that a combination of these measures cannot be used to advantage.

The present disclosure is also applicable to devices comprising one or more of the characterizing features described in the specification and/or shown in the accompanying drawings. The present disclosure is also directed to a method or process comprising one or more of the characterizing features described in the specification and/or shown in the accompanying drawings.

Various aspects discussed in the present application can be combined to provide additional advantages. In addition, some of the features may form the basis of one or more divisional applications.

LIST OF REFERENCE NUMERALS

| | |
|---|---|
| 10 20 30 40 | touch display apparatus |
| 11 21 31 41 | first substrate |
| 12 22 32 42 | second substrate |

-continued

| | |
|---|---|
| 13 | light source |
| 14 24 34 44 | touch sensor |
| 15 25 35 45 | interference color filter |
| 151 251 351 | first sub-interference color filter |
| 152 252 352 | second sub-interference color filter |
| 153 253 353 | third sub-interference color filter |
| 231 | sub-light source |
| 36 46 | surface light source |
| 37 47 | liquid crystal layer |
| 481 | color film unit |

The invention claimed is:

1. A touch display apparatus, comprising:
a first substrate and a second substrate opposite to each other;
a light source on a side of the second substrate facing the first substrate;
a plurality of touch sensors in an array on a side of the first substrate facing the second substrate; and
one or more interference color filters on a side of each touch sensor facing the second substrate,
wherein the light source is configured to emit light towards the one or more interference color filters,
wherein each of the one or more interference color filters comprises a first sub-interference color filter, a second sub-interference color filter and a third sub-interference color filter configured to output different colors of light, respectively,
wherein the light source comprises a surface light source and a liquid crystal layer stacked over each other, and the surface light source is located between the second substrate and the liquid crystal layer,
wherein the surface light source is configured to emit white light, and
wherein the liquid crystal layer comprises a plurality of liquid crystal portions arranged in an array and separated from each other, and
wherein an orthographic projection of each liquid crystal portion of the plurality of liquid crystal portions on the first substrate is overlapped by an orthographic projection of a corresponding one of the first, second or third sub-interference color filters on the first substrate.

2. A touch display apparatus, comprising:
a first substrate and a second substrate opposite to each other;
a light source on a side of the second substrate facing the first substrate;
a plurality of touch sensors in an array on a side of the first substrate facing the second substrate; and
one or more interference color filters on a side of each touch sensor facing the second substrate,
wherein the light source is configured to emit light towards the one or more interference color filters,
wherein each of the one or more interference color filters comprises a first sub-interference color filter, a second sub-interference color filter and a third sub-interference color filter configured to output different colors of light, respectively,
wherein the light source comprises a surface light source and a liquid crystal layer stacked over each other,
wherein the surface light source is configured to emit white light,
wherein the liquid crystal layer comprises a plurality of liquid crystal portions in an array, and
wherein an orthographic projection of each liquid crystal portion on the first substrate is overlapped by an orthographic projection of one sub-interference color filter of the first, second or third sub-interference color filters on the first substrate,
wherein the light source further comprises a color film layer, and
wherein the color film layer comprises a plurality of color film units,
wherein an orthographic projection of each color film unit on the first substrate is overlapped by an orthographic projection of the one sub-interference color filter of the first, second or third sub-interference color filters on the first substrate, and
wherein each color film unit is configured to emit a same color of light as the one sub-interference color filter.

3. A driving method for a touch display apparatus, the touch display apparatus comprising:
a first substrate and a second substrate opposite to each other;
a light source on a side of the second substrate facing the first substrate;
a plurality of touch sensors in an array on a side of the first substrate facing the second substrate; and
one or more interference color filters on a side of each touch sensor facing the second substrate,
wherein the light source is configured to emit light towards the one or more interference color filters,
wherein each of the one or more interference color filters comprises a first sub-interference color filter, a second sub-interference color filter and a third sub-interference color filter configured to output different colors of light, respectively,
wherein the driving method comprises:
driving the light source and each interference color filter to display in a set gray scale;
recording a non-touch color coordinate in a color space for light output from each interference color filter in case of no touch;
recording a touch color coordinate in the color space for light output from each interference color filter in case of touch; and
determining a touch position by comparing the non-touch color coordinate and the touch color coordinate.

4. The driving method according to claim 3,
wherein the color space comprises CIE 1964 color space, and
wherein the non-touch color coordinate and the touch color coordinate comprise a chrominance component coordinate.

5. The driving method according to claim 3, wherein the light source comprises an organic light emitting diode (OLED) light source, and wherein the driving method further comprises repeating at different display moments in time of the organic light emitting diode (OLED) light source operations comprising:
driving the OLED light source and each interference color filter to display in the set gray scale;
recording the non-touch color coordinate in a color space for light output from each interference color filter in the case of no touch;
recording the touch color coordinate in the color space for light output from each interference color filter in the case of touch; and
determining the touch position by comparing the non-touch color coordinate and the touch color coordinate.

* * * * *